(12) United States Patent
Mueller

(10) Patent No.: US 6,935,412 B2
(45) Date of Patent: Aug. 30, 2005

(54) COOLER FOR ELECTRICAL AND/ OR ELECTRONIC COMPONENTS, LINKED TO PRESENT COOLING NEEDS

(75) Inventor: Marcus Mueller, Sindelfingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/154,319

(22) Filed: May 22, 2002

(65) Prior Publication Data

US 2002/0189794 A1 Dec. 19, 2002

(30) Foreign Application Priority Data

May 25, 2001  (DE) ......................................... 101 25 636

(51) Int. Cl.[7] .................................................. F28F 7/00
(52) U.S. Cl. ............................... 165/80.4; 165/104.33; 165/170; 361/699; 174/15.1; 257/714
(58) Field of Search ............................. 165/80.4, 80.5, 165/170, 146, 185, 104.33; 361/699; 174/15.1; 257/714

(56) References Cited

U.S. PATENT DOCUMENTS

| | | | | |
|---|---|---|---|---|
| 2,039,593 A | * | 5/1936 | Hubbuch et al. | 165/170 |
| 3,327,776 A | * | 6/1967 | Butt | 165/80.4 |
| 3,361,195 A | * | 1/1968 | Meyerhoff et al. | 165/80.4 |
| 4,432,414 A | * | 2/1984 | Morgan | 165/140 |
| 5,099,311 A | * | 3/1992 | Bonde et al. | 165/80.4 |
| 5,179,500 A | * | 1/1993 | Koubek et al. | 361/700 |
| 5,275,237 A | * | 1/1994 | Rolfson et al. | 165/80.5 |
| 6,039,114 A | * | 3/2000 | Becker et al. | 165/170 |
| 6,257,320 B1 | * | 7/2001 | Wargo | 165/80.4 |
| 6,535,386 B2 | * | 3/2003 | Sathe et al. | 361/700 |
| 6,536,516 B2 | * | 3/2003 | Davies et al. | 165/170 |

FOREIGN PATENT DOCUMENTS

| | | | | |
|---|---|---|---|---|
| DE | 92 01 158 U1 | 3/1992 | | |
| DE | 196 00 166 A1 | 7/1997 | | |
| DE | 198 00 166 A1 | 7/1997 | | |
| JP | 07038025 A2 | 2/1995 | | |
| JP | 07-038025 | * | 2/1995 | 165/80.4 |
| JP | 2000323636 A | * | 11/2000 | 165/80.4 |

* cited by examiner

Primary Examiner—Terrell Mckinnon

(57) ABSTRACT

A cooler for electric and/or electronic components with a cooling body including a first flat outer wall and a second flat outer wall at a certain distance from each other and each creating a cooling area. There are cavities between the outer walls on the inside of the cooling body, creating a cooling channel connecting an inflow with an outflow through which a liquid cooling agent can flow. The cooling channel between inflow and outflow runs completely on the inside of the cooling body, and the cooling body is made up of a first part and a second part. The first part has the first outer wall, and at least the first part has a first set of indentations on a first inner wall opposite to the first outer wall, and wherein those indentations are closed off by the second part on the wall opposite of the first outer wall when the cooling body is assembled, thus creating the cooling channel. The course of the cooling channel and/or the arrangement of the cooling section or the cooling sections in the respective application case for which the cooler was designed is adapted to the cooling needs at the first outer wall and/or the second outer wall.

10 Claims, 3 Drawing Sheets

Figure 1:
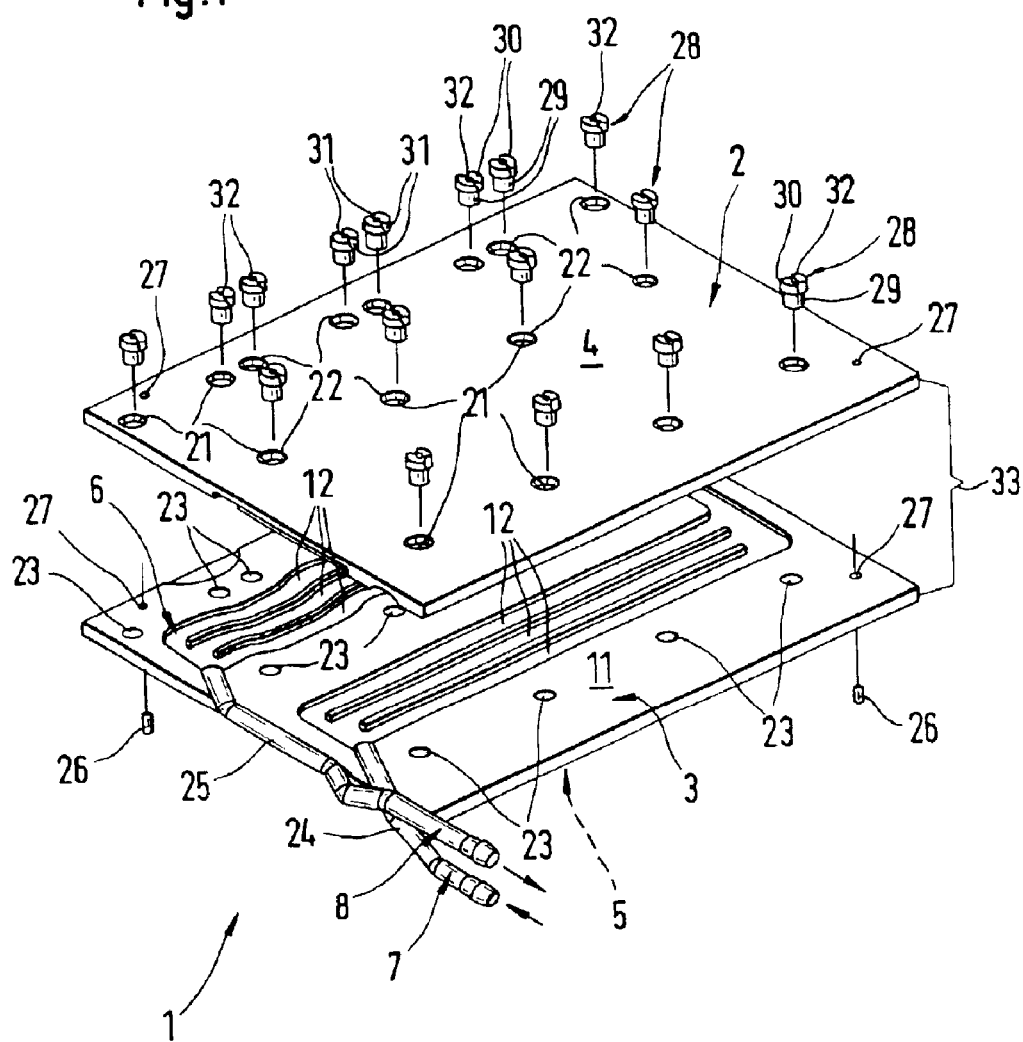

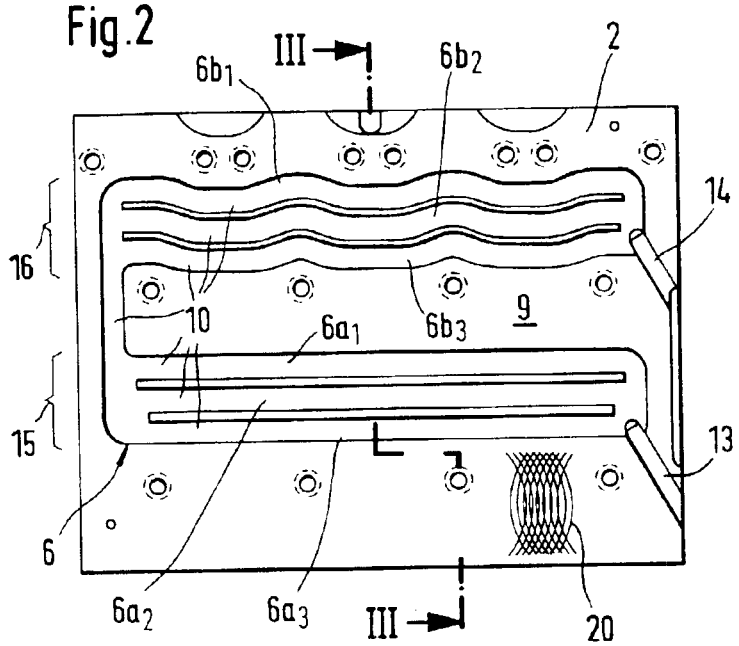
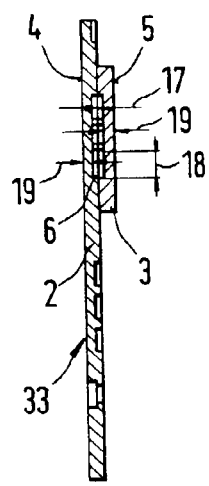
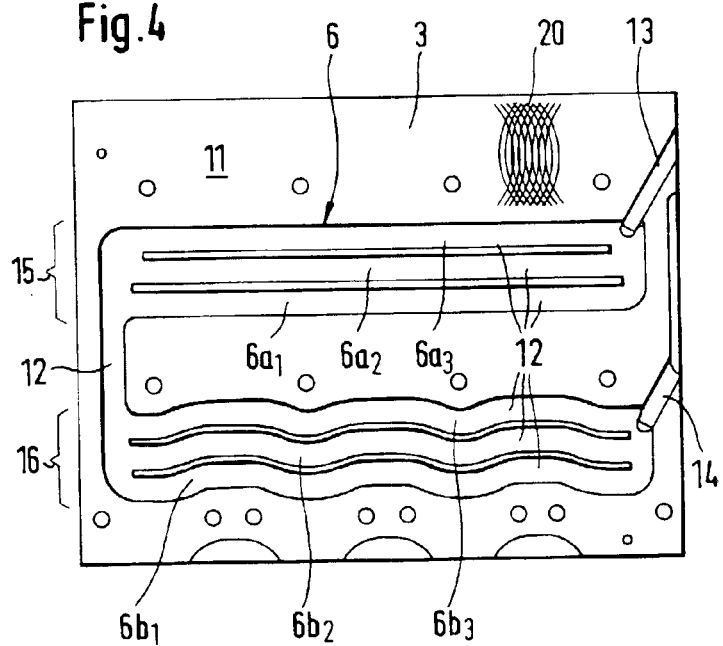

COOLER FOR ELECTRICAL AND/OR ELECTRONIC COMPONENTS, LINKED TO PRESENT COOLING NEEDS

BACKGROUND OF THE INVENTION

1. Field of the Invention

The present invention concerns a cooler for electrical and/or electronic components, more particularly a cooler used in a testing system for semiconductors.

2. Discussion of the Background Art

The lifetime and proper functioning of electric and/or electronic components, in particular microprocessors, depends heavily on their thermal strain. In order to increase the lifetime and to ensure optimum functioning, coolers of the above-mentioned type are used for cooling such thermally strained components.

Coolers for the most varied applications and in different embodiments are known from, among others, JP-A-07038025, DE-A-19600166, JP-A-2000323636, DE-A-19800166, and DE-U-9201158.

SUMMARY OF THE INVENTION

It is the object of the present invention to propose an improved cooler, more particularly a cooler with high cooling power and a compact design. This problem will be solved by the characteristics of the independent claim. Advantageous embodiments are stated in the dependent claims.

The invention is based on the concept of designing the cooling body in two parts, the first part and the second part, wherein a least in the first part, there are indentations, which are closed of by the second part, thus forming the cooling channel. With this construction, it is possible to design the geometry, in particular the cross section and the course, of the cooling channel relatively freely. The cooling channel is set inside the cooling body so that it is completely contained in the inside of the cooling body, this means that no cooling channel sections, such as U-shaped tubes, have to protrude from the walls of the cooling body. The result is a maximum use of the space inside the cooling body in combination with a minimum size for the cooler. The indentation can be created in a full body by a cutting process, for example a milling process. Similarly it is possible to create the first part with the indentations in a die casting process or a pressure die casting process. The geometry of the cooling channel is no longer determined by the manufacturing process of the cooling body, but can be chosen relatively freely. In particular, the cross section of the cooling channel, and thus the flow rate of the coolant, can be chosen so large that the flow resistance remains relatively low even for a relatively long cooling channel. This is achieved by sequential or parallel arrangement of the individual channel sections.

The course of the cooling channel and/or the arrangement of the cooling section or the cooling sections in the respective application case for which the cooler was designed is adapted to the cooling needs at the first outer wall and/or the second outer wall. With this design, optimum cooling for the components to be cooled may be achieved. In particular, zones with increased cooling power and zones with reduced cooling power can be created on the respective outer wall or in the cooling area created by those walls.

According to a preferential embodiment, the cooling channel may consist of two partial channels at least in one channel section. The coolant flows through those partial channels parallel during the operation of the cooler. It is advantageous to provide these channel sections at points of the cooling channel that have increased cooling needs at a first outer wall and/or a second outer wall. For example, the components to be cooled may be in contact with the cooler precisely at these points. With this design, more intensive, and particularly more targeted, cooling may be achieved for the elements to be cooled.

According to a special embodiment, the second part of the cooler can provide the second outer wall, in which case the second part also contains a second set of indentations on an inner wall opposite of the second outer wall, which correspond to the first set of indentations of the first part. When the cooling body is assembled, the indentations on the second part on the wall opposite of the second outer wall are closed by the first part, wherein the first set of indentations and the second set of indentations together create the cooling channel. With this embodiment, larger cross sections for the cooling channel and the cooling channel sections may be achieved, thereby decreasing the flow resistance.

In a special embodiment, the cross section of the cooling channel may be wider than it is high in at least a section, whereby the height is measured perpendicularly to the outer walls. In that respective section, the cooling channel is then designed relatively flat, making it possible to realize relatively wide cooling zones on the outer walls. Furthermore, this design makes a particularly flat construction of the cooling body possible; the cooler as a whole can thus be designed relatively compact.

It is advantageous to choose the height of the cooling channel, measured perpendicularly to the outer wall, to be larger than a distance between a channel wall and the outer wall next to it. The small distance improves the heat transport through the construction material of the cooling body, thus increasing the cooling power. At the same time, the cooler can be constructed flat and compact.

Since the geometry of the cooling channel can be designed relatively freely due to the construction of the cooling body according to the invention, the cooling channel can also be purposely designed, in particular with respect to the cross section course and length, so that a minimized temperature gradient is achieved between inflow and outflow during the operation of the cooler. Consequently, a generally equal cooling effect can be achieved for components in proximity to the inflow as well as for components in proximity of the outflow.

According to a preferential embodiment, the inflow and outflow can be in close proximity to each other. Due to the fact that the geometry of the cooling channel can be chosen freely according to the invention, the cooling channel can be designed inside the cooling body so that inflow and outflow are close to each other. On one hand, this construction facilitates the assembly and maintenance of the cooler. On the other hand, the room needed for the installation is reduced and the device containing the cooler can be designed in a more compact manner.

In a special embodiment, screw bolts can be provided to connect the two parts. These screw bolts each have a shaft with in outer thread and a head that protrudes radially over the outer thread and have a plane front on the axial outside, wherein the shaft of every screw bolt penetrates a passage opening, which is provided in the one part, and acts together with an inside thread that is provided in the other part and that is level with the passage opening, and wherein the head of each screw bolt is sunk into a depression surrounding the passage opening. With the aid of these screw bolts, the two parts may be strongly attached to each other, effectively preventing deformations of the two parts even at relatively high pressures in the cooling channel. Furthermore, such a union can be created relatively easily by machines and can be automated.

In a further development, at least one of these screw bolts may have an inner thread that is coaxial to the outer thread and that is open on the axial front side of the head and/or on one axial end of the shaft. These inner threads offer the possibility to screw other components or elements to the cooler. In particular, a close contact between the cooling area and the component to be cooled can be achieved to improve the cooling effect. The advantage of this embodiment becomes especially evident when the parts of the cooler are made of aluminum or an aluminum alloy in order to improve the heat transfer while the screw bolts are made for example of brass, steel, or a steel alloy. Threads in an aluminum material can generally be used only once, in particular if the thread has a relatively small nominal size. Since brass and steel are considerably more resistant than aluminum, threads made of these materials are also considerably more resistant and can therefore be used more than once. This is of particular importance if the elements attached to the cooler must be removed and reattached for maintenance or repair purposes.

In addition to these screw connections, the parts may also be glued to each other at the inner walls where they make contact. The screw connections then facilitate the manufacturing process because they also serve as a fixation for the glue connection until the glue hardens.

A particularly strong glue connection can be realized if the inner walls of the two parts that are in contact have a relatively high surface roughness. As a result of this measure, there are extremely large surfaces that are coated by the glue so that a strong bond between the parts is ensured after the glue hardens.

BRIEF DESCRIPTION OF THE DIAGRAMS

The following gives a further description of the invention with reference to the diagrams, wherein the same reference marks refer to identical, functionally identical, or similar features. It is shown schematically in FIG. 1: a perspective representation of a cooler according the invention in an exploded view, FIG. 2: a top view of the inner wall of one part of the cooler, FIG. 3: a cut-away view according to the intersection lines III in FIG. 2, FIG. 4: a view of the inner wall of the other part of the cooler, FIG. 5: a view of the one side of the cooler, FIG. 6: a side view according to the arrow VI in FIG. 5, and FIG. 7: a view of the other side of the cooler.

DETAILED DESCRIPTION OF THE DIAGRAMS

According to FIG. 1, a cooler 1 according to the invention contains a cooling body 33 made up of a first plate-like part 2 and a second plate-like part 3. The first part 2 has an outer wall 4 facing the observer. This outer wall is plane in this case. Similarly, the second part 3 also has an outer wall 5, facing away from the observer. This wall is also plane in this case and runs effectively parallel to the outer wall 4 of the first part 2. Unlike in the shown embodiment, the outer walls 4 and 5 can generally have an arbitrary outer contour. More particularly, their topography may be adapted to a certain application in order to achieve a very compact design.

The outer walls 4 and 5 serve as the cooling areas of the cooler 1. When the cooler 1 is installed, for example in a testing facility for semiconductors, these surfaces are in direct or indirect contact to the electric and/or electronic components, such as microprocessors, using a surface as large as possible. Typically, the electric or electronic components to be cooled are attached to a frame, more particularly to a circuit board, which in turn can be attached to the cooling body with which it has a large contact surface. The components to be cooled then release their heat to the respective outer wall 4 or 5 through which the heat reaches the inside of the cooling body 33. In the inside of the cooling body 33, there is a cooling channel 6, which connects an inflow 7 with an out-flow 8. A liquid cooling agent, preferably water, flows through the cooling channel 6 during the operation of the cooler 1, removing the heat transferred to the cooling body 33.

According to FIG. 2 and 4, there are a first set of indentations 10 in a first inner wall 9 of the first part 2, and a second set of indentations 12 on a second inner wall 11 of the second part 3. The first set of indentations 10 and the second set of indentations 12 in the given case are mirror-symmetric to each other and create cavities that are in contact when the inner walls 9 and 11 are in contact, thus creating the cooling channel 6. It is of particular importance that the so created cooling channel 6 runs completely in the inside of the cooling body 33, with the exception of an inlet opening 13 and an outlet opening 14. This means that the available space for construction is used most efficiently, permitting a very compact design of the cooler 1.

As it is particularly evident from FIG. 2 and 4, the cooling channel 6 has two channel sections 15 and 16 along its course between inlet opening 13 and outlet opening 14. In those sections, the cooling channel 6 consists of three partial channels each, 6a or $6a_1$, $6a_2$, $6a_3$ and 6b or $6b_1$, $6b_2$, $6b_3$. These partial channels, $6a_1$ to $6a_3$ and $6b_1$ to $6b_3$ are parallel to each other, and the cooling agent flows parallel through them during the operation of the cooler 1. By this design, a large area zone with intensive heat transport is created in the area of the channel sections 15 and 16 on each the first outer wall 4 and the second outer wall 5. These zones are particularly suited for cooling the heated components. In this manner, zones with increased cooling power and zones with relatively low cooling power can be created on the outer walls 4 and 5 of the cooler 1. The creation of these zones depends on the course of the cooling channel 6 inside the cooling body 1, and in particular on the creation of the channel sections 15, 16 with parallel partial channels 6a and 6b. With the parallel partial channels 6a and 6b, there is a relatively short flow distance for each flow path between inflow 7 and outflow 8, so that the total flow resistance remains relatively low. In addition, the cooling channel 6 is designed such that it only circulates once in the cooling body 33 between inflow 7 and outflow 8, therefore only creating one loop. Consequently, the cooling channel 6 is relatively short in total so that a very small temperature gradient can be achieved between inflow 7 and outflow 8.

In the embodiment shown here, the cooling channel 6, or its partial channels 6a and 6b, have a rectangular cross section, whereby the height 17, measured perpendicularly to the outer wall 4 or 5, is considerably smaller than a width 18, measured perpendicularly to the height. Preferably, this height 17 of the channel is also larger than the wall thickness 19 of the first part 2 and the second part 3 in the area of the channel cross section. As a result, the heat transport paths between the respective outer walls 4 or 5 and the cooling channel 6, and thus the cooling agent, are short.

It is of particular importance that the cooling channel 6 or its partial channels 6a and 6b in the respective part 2 or 3 can be created very easily by a cutting process, more particular a milling process. In this manufacturing procedure, the desired courses and dimensions for the cooling channel 6 or the partial channels 6a and 6b can be realized particularly easily.

The inner walls, 9 and 11, have a relatively high surface roughness, which is achieved by scrubbing for example. The scrubbed surfaces are indicated at 20. When assembling the two parts, 2 and 3, the inner walls in contact, 9 and 11, are glued to each other. Firstly, the high surface roughness prevents the glue from being all driven out from between the parts 2 and 3 when those parts are pressed together. Secondly, it provides a large glue surface, resulting in a strong glue bond when the glue hardens.

According to FIG. 1, the first part 2 has a large number of passage openings 21, wherein each of these passage openings 21 on the first outer wall 4 is surrounded by a depression, more particularly a cylinder depression 22. The second part 3 has a corresponding number of inside threads 23 protruding the second part 3, which are level with the passage openings 21 of the first part 2. After inserting an inlet tube 24 and an outlet tube 25, the parts 2 and 3 are put onto each other. For precise positioning, dowel pins 26 may act together with dowel holes 27.

Furthermore, screw bolts 28 are provided, each consisting of a shaft 29 and a head 30. The shaft 29 has an outside thread that is designed complementary to the inner thread 23 of the second part 3. The head 30 protrudes radially over the shaft 29 and has a plane front side on the axial outside. The diameter of the head 30 is chosen such that the head 30 can be sunk in the depression 22. The diameter of the passage opening 21 is chosen such that the shaft 29 can be inserted in the passage opening 21, more particularly with allowance. To connect the two parts 2 and 3 to each other, the screw bolts 28 are thus inserted in the passage openings 21 and screwed into the inside threads 23. The axial extent of the heads 30 and the depressions 22 are adjusted to each other such that the heads 30 are sunk completely in the depressions 22 when the screw bolts 28 are screwed on tightly.

In order to be able to screw in the screw bolts, there are two indentations, pockets, or recesses 31, opposite on the diameter, in their heads. An accordingly designed tool, for example with suitable spikes, can then reach positively into these indentations.

Another special feature of these screw bolts 28 is the fact that each screw bolt 28 has a concentric inside thread 32, which is continuous in the present embodiment. This means that it is designed axially open on the axial front side of the head 30 as well as on the opposite axial end of the shaft 29. This inside thread can be used to attach components or the like to achieve a stronger bond between the respective component and the outer wall 4 or 5 of the cooler 1.

The screw bolts 28 thus have several functions in this embodiment. On one hand, the screw bolts serve as a connector between the two parts 2 and 3 during the operation of the cooler 1 in order to absorb the forces that are created by the pressure of the cooling agent in the cooling channel 6, which try to drive apart the two parts 2 and 3. On the other hand, they aid the positioning of the parts 2 and 3 when creating a glue bond between the parts 2 and 3 so that the glue can harden without interruption in the manufacturing process. Furthermore, the screw bolts 28 with their inside thread serve as fastening elements that can be used to fix corresponding components to the cooling body 33.

Figure 5:
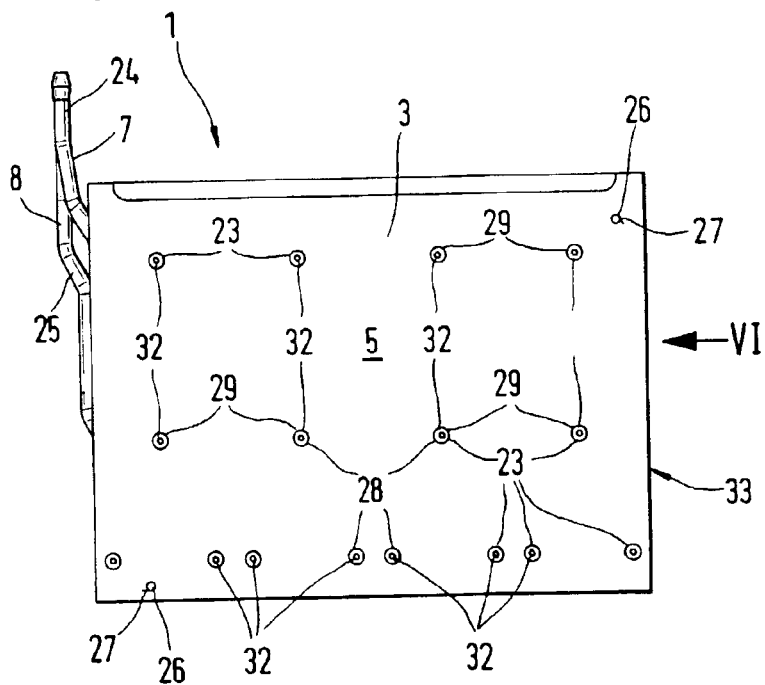

FIG. 5 shows a view of the outer wall 5 of the second part 3. The axial ends of the shafts 29 of the screw bolts 28 with the open inside threads are clearly visible. The inside threads 23 of the second part 3 are thus designed continuously. Using the screw bolts 28 according to the invention, it is thus possible to screw elements or assemblies to be cooled, more particularly circuit boards, to the outer wall 5 of the second part 3.

Figure 7:
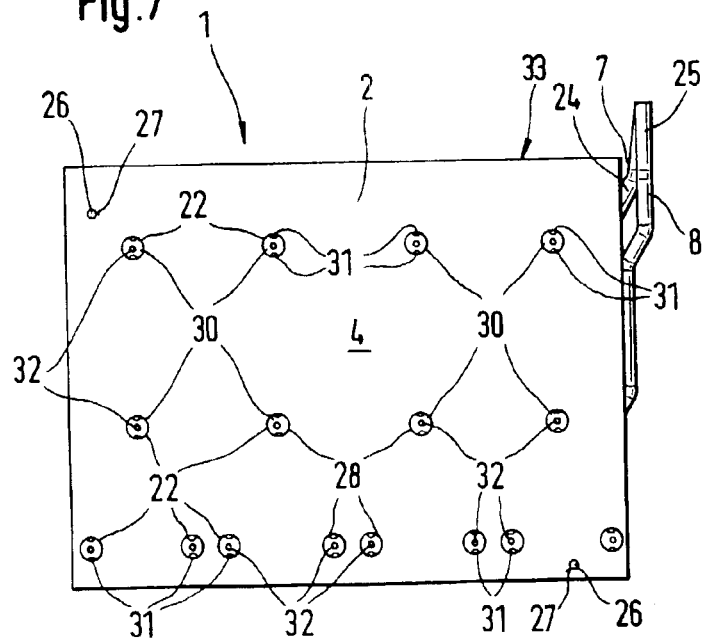

The same holds true for the outer wall 4 of the first part 2, according to FIG. 7. There, the beads 30 of the screw bolts 28 are sunk into the depressions 22. With the inside threads 32, which are open on this wall as well, components to be cooled can also be screwed to the outer wall 4 of the first part 2.

Figure 6:
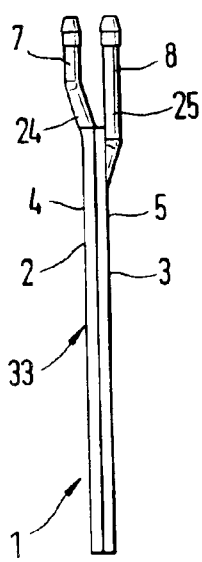

The side view according to FIG. 6 shows the extremely flat design of the cooler according to the invention. Of particular importance is also the arrangement of inflow 7 and outflow 8, which are relatively close together. The result is a minimum installation space for the cooler 1 so that the electric device to be equipped with the cooler also needs to provide less installation space.

What is claimed is:

1. A cooler for electric or electronic components with a cooling body, said cooling body comprising a first flat outer wall and a second flat outer wall spaced a certain distance from each other and each wall creating a cooling area, wherein:

cavities, between said outer walls, inside of said cooling body, form a cooling channel, said cooling channel connecting an inflow with an outflow through which a liquid cooling agent can flow;

said cooling channel, between said inflow and said outflow, runs completely inside of said cooling body;

said cooling body comprises a first part and a second part;

said first part comprising said first outer wall and a first inner wall opposite of said first outer wall;

at least said first part comprising a first set of indentations in said first inner wall to therein form said cavities, wherein said first set of indentations are closed off by said second part when said cooling body is assembled, thus forming said cooling channel, wherein said cooling channel is routed along a course that provides for cooling needs for at least one of said first outer wall or said second outer wall, wherein screw bolts are provided for connecting said first and second parts to each other, wherein said screw bolts each comprise a shaft with an outer thread and a head that protrudes radially over said shaft and has a plane front side on an axial outside, wherein said shaft of each screw bolt penetrates an opening passage that is created in said first part and that acts together with an inside thread that is created flush with an opening passage in said second part, and wherein said head of each screw bolt is sunk in a depression surrounding said opening passage.

2. A cooler according to claim 1, wherein several recesses are created on said head of at least one screw bolt on a radial outside, and wherein said recesses are used to screw in said screw bolt.

3. A cooler for electric or electronic components with a cooling body, said cooling body comprising a first flat outer wall and a second flat outer wall spaced a certain distance from each other and each wall creating a cooling area, wherein:

cavities, between said outer walls, on said inside of said cooling body, form a cooling channel, said cooling channel connecting an inflow with an outflow through which a liquid cooling agent can flow;

said cooling channel, between said inflow and said outflow, runs completely inside of said cooling body;

said cooling body comprises a first part and a second part;

said first part comprising said first outer wall and a first inner wall opposite of said first outer wall;

at least said first part comprising a first set of indentations in said first inner wall to therein form said cavities, wherein said first set of indentations are closed off by said second part when said cooling body is assembled, thus forming said cooling channel, wherein said cooling channel is routed along a course that provides for cooling needs for at least one of said first outer wall or said second outer wall; and a screw bolt connects said first part to said second part, wherein said screw bolt comprises a head, a shaft and having an outside thread, and an inside thread that is arranged coaxially to said outside thread, and wherein said inside thread is open on at least one of (a) an axial front of said head, or (b) an axial end of said shaft.

4. A cooler according to claim 1, wherein said first and second parts are glued to each other on inner contact surfaces.

5. A cooler according to claim 4, wherein said inner walls have a surface roughness.

6. A cooling body for electric or electronic components, comprising:

a first part having a first inner wall that includes a channel;

a second part having a second inner wall situated against said first inner wall;

an inflow through which a cooling agent enters said channel; and an outflow through which said cooling agent exists said channel, wherein said channel provides relatively more cooling to said first zone of said cooling body as compared to a second zone of said cooling body, and wherein said channel, in said first zone, includes a first partial channel and a second partial channel.

7. The cooling body of claim 6, wherein said first partial channel and said second partial channel are parallel to one another.

8. The cooling body of claim 6, wherein said first partial channel and said second partial channel are parallel to one another in a direction of a flow of said cooling agent.

9. The cooling body of claim 6, wherein said channel does not traverse through said second zone.

10. The cooling body of claim 6, wherein said channel is configured as a single channel in said second zone.

* * * * *